(12) United States Patent
Chen et al.

(10) Patent No.: US 11,289,157 B1
(45) Date of Patent: Mar. 29, 2022

(54) MEMORY DEVICE

(71) Applicant: Winbond Electronics Corp., Taichung (TW)

(72) Inventors: Frederick Chen, San Jose, CA (US); Ping-Kun Wang, Taichung (TW); Kuang-Chih Hsieh, Taichung (TW); Chien-Min Wu, Taichung (TW); Meng-Hung Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/012,077

(22) Filed: Sep. 4, 2020

(51) Int. Cl.
  *G11C 13/00* (2006.01)
  *H01L 45/00* (2006.01)

(52) U.S. Cl.
  CPC ...... *G11C 13/0026* (2013.01); *G11C 13/0028* (2013.01); *H01L 45/146* (2013.01)

(58) Field of Classification Search
  CPC ............ G11C 13/0026; G11C 13/0028; H01L 45/146
  See application file for complete search history.

(56) References Cited

U.S. PATENT DOCUMENTS

| 9,601,498 | B2 | 3/2017 | Bertin et al. | |
| 10,115,897 | B1 | 10/2018 | Sato | |
| 2008/0116576 | A1* | 5/2008 | Moon | H01L 21/76844 |
| | | | | 257/751 |
| 2012/0075907 | A1 | 3/2012 | Jo | |
| 2013/0087757 | A1* | 4/2013 | Chen | H01L 27/2481 |
| | | | | 257/4 |
| 2015/0129827 | A1* | 5/2015 | Chen | H01L 45/1226 |
| | | | | 257/4 |
| 2015/0340610 | A1* | 11/2015 | Jung | H01L 27/2409 |
| | | | | 257/4 |
| 2016/0064453 | A1 | 3/2016 | Hou et al. | |
| 2017/0271402 | A1* | 9/2017 | Chen | H01L 27/2454 |
| 2019/0131525 | A1 | 5/2019 | Ando et al. | |
| 2021/0159406 | A1* | 5/2021 | Wei | H01L 45/16 |
| 2021/0210553 | A1* | 7/2021 | Yano | G11C 13/0007 |

FOREIGN PATENT DOCUMENTS

TW  201735413  10/2017

OTHER PUBLICATIONS

"Office Action of Taiwan Counterpart Application", dated Jan. 5, 2022, p. 1-p. 6.

* cited by examiner

*Primary Examiner* — Khamdan N. Alrobaie
(74) *Attorney, Agent, or Firm* — JCIPRNET

(57) ABSTRACT

A memory device includes: a resistive switching layer, a conductive pillar, a barrier layer, a word line, a plurality of resistive layers, and a plurality of bit lines. The resistive switching layer is shaped as a cup and has an inner surface to define an opening. The conductive pillar is disposed in the opening. The barrier layer is disposed between the resistive switching layer and the conductive pillar. The word line is electrically connected to the conductive pillar. The resistive layers are respectively distributed on an outer surface of the resistive switching layer. The bit lines are electrically connected to the resistive layers, respectively.

10 Claims, 21 Drawing Sheets

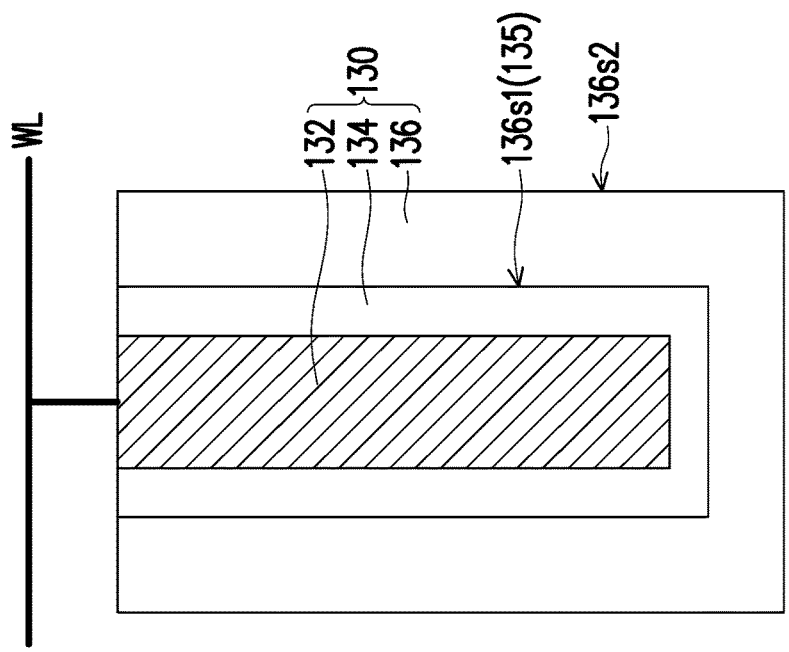
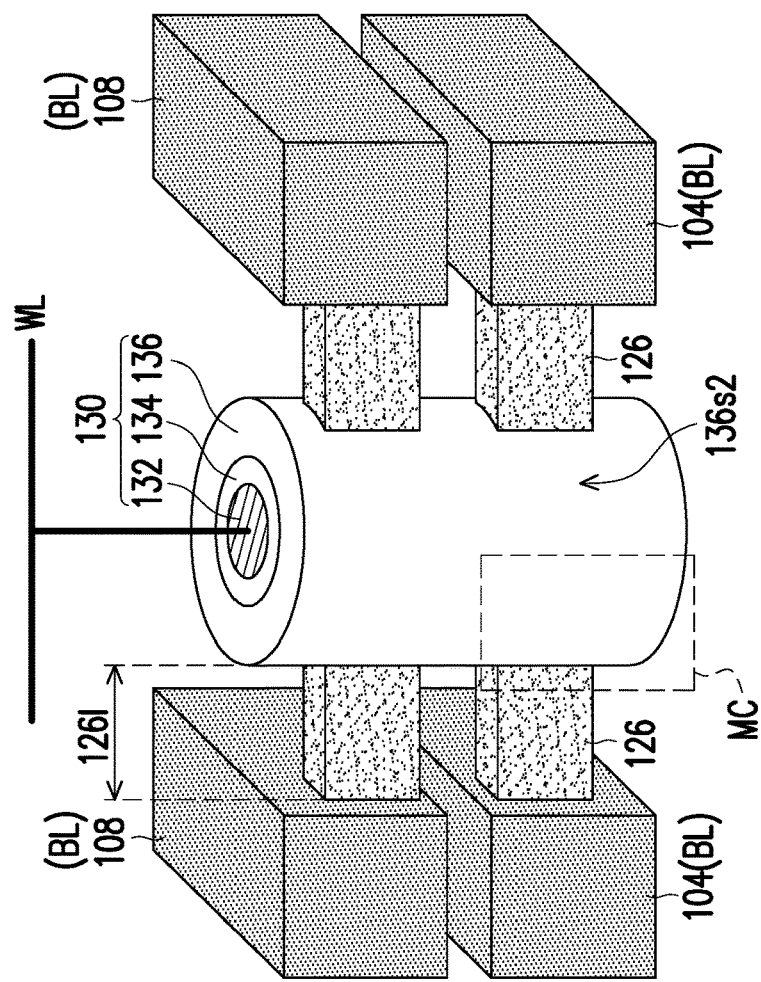
FIG. 4B
FIG. 4A

MEMORY DEVICE

BACKGROUND

Technical Field

The disclosure relates to a memory device.

Description of Related Art

Recently, resistive random access memories (RRAMs), characterized by advantages including simple crossbar array structures and low-temperature manufacturing processes, have been widely applied in the technical field of non-volatile memories. Since the crossbar RRAM is designed according to the concept of a resistive switching device (i.e., 1R), compared to a 1-transistor-1-resistor (1T1R) or a 1-selector-1-resistor (1S1R) structure, the crossbar RRAM structure may theoretically have not only a smaller cell size but also a lower operation voltage. In other words, the crossbar RRAM may have high integration density and may effectively reduce the operating voltage.

However, the crossbar RRAM still encounters certain issues, e.g., sneak current and snapback during memory operation.

SUMMARY

The disclosure provides a memory device where resistive layers having a specified resistance value are disposed between a bit line and a resistive switching layer, so as to solve a snapback problem (shorting of the bit line to an intersecting line by the resistive switching layer) while the resistive switching layer is transformed from an initially insulating layer into a switching layer with much less resistance.

An embodiment of the disclosure provides a memory device including a resistive switching layer, a conductive pillar, a barrier layer, a word line, a plurality of resistive layers, and a plurality of bit lines. The resistive switching layer is shaped as a cup and has an inner surface to define an opening. The conductive pillar is disposed in the opening. The barrier layer is disposed between the resistive switching layer and the conductive pillar. The word line is electrically connected to the conductive pillar. The resistive layers are respectively distributed on an outer surface of the resistive switching layer. The bit lines are electrically connected to the resistive layers, respectively.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 4A is a schematic three-dimensional view illustrating the memory cell in FIG. 3I.

FIG. 4B is a schematic cross-sectional view illustrating the memory cell in FIG. 4A.

DESCRIPTION OF THE EMBODIMENTS

Figure 1:
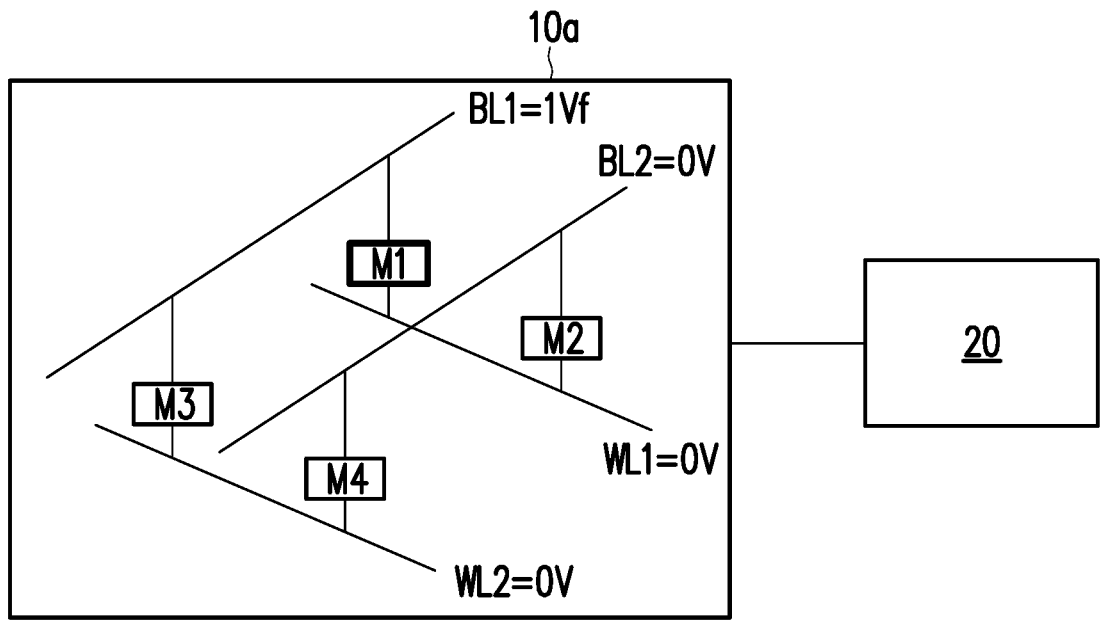
FIG. 1 is a schematic view illustrating a theoretical formation state of a crossbar RRAM device.
Figure 2:
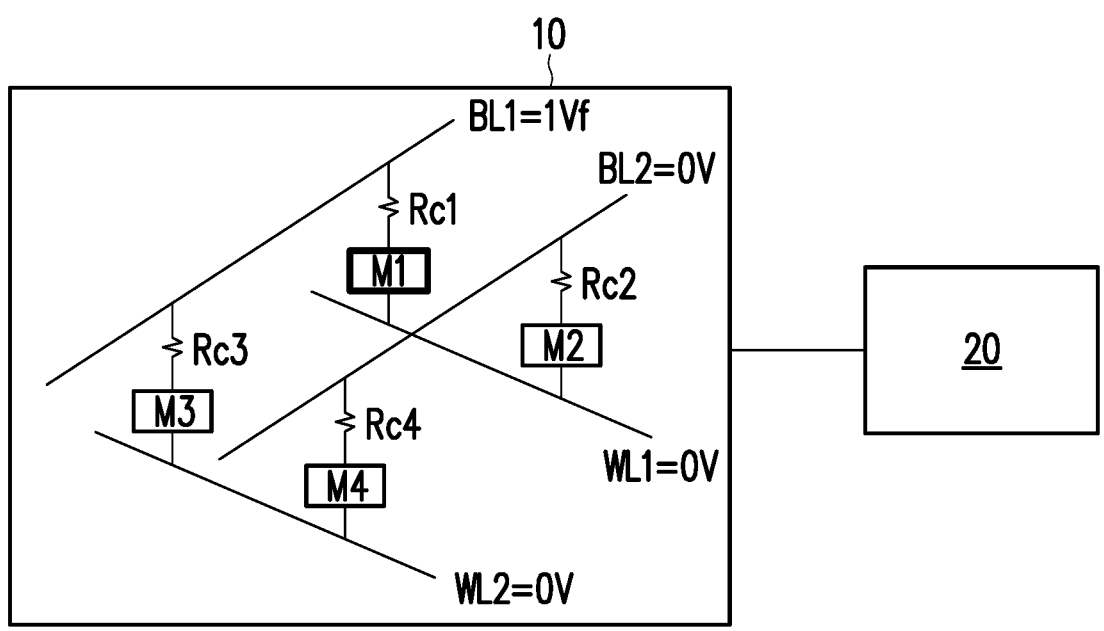
FIG. 2 is a schematic view illustrating a formation state of a crossbar RRAM device according to an embodiment of the disclosure.

FIG. 1 is a schematic view illustrating a theoretical formation state of a crossbar RRAM device. FIG. 2 is a schematic view illustrating a formation state of a crossbar RRAM device according to an embodiment of the disclosure.

With reference to FIG. 1, when a memory cell M1 is selected for performing a forming operation, a forming voltage of 1 unit (1 Vf) is applied to a first bit line BL1, and 0 voltage is applied to a second bit line BL2, a first word line WL1, and a second word line WL2 (e.g., grounded). Under such circumstances, the memory cell M1 is turned on and thus leads to a snapback, which is a sudden and significant voltage drop between the intersecting first bit line BL1 and first word line WL1. This pulls the voltage of the first word line WL1 to be the same as the voltage of the first bit line BL1, which in turn can cause the improper disturb or switching of memory cell M2 with an opposite polarity voltage of 1 Vf.

An embodiment of the disclosure provides a crossbar RRAM device 10 including a memory array. The memory array includes: a first bit line BL1, a second bit line BL2, a first word line WL1, a second word line WL2, a plurality of memory cells M1, M2, M3, and M4, and a plurality of contact resistors Rc1, Rc2, Rc3, and Rc4. Specifically, the memory cells M1, M2, M3, and M4 are located at overlapping regions of the first bit line BL1, the second bit line BL2, the first word line WL1, and the second word line WL2, respectively. The contact resistors Rc1, Rc2, Rc3, and Rc4 are respectively located between the memory cells M1, M2, M3, and M4 and the first bit line BL1 and the second bit line BL2. When the memory cell M1 is selected for performing a formation operation, a voltage of 1 unit (1 Vf) is applied to the first bit line BL1, and 0 voltage is applied to the second bit line BL2, the first word line WL1, and the second word line WL2 (e.g., grounded). Under such circumstances, the memory cell M1 is turned on, and almost all voltages are loaded to the contact resistor Rc1 without being transferred to the first word line WL1, thereby solving the issue of possible disturb of memory cell M2 caused by snapback.

FIG. 3A to FIG. 3I are schematic three-dimensional views of a manufacturing process of a memory device according to a first embodiment of the disclosure. The memory device described in the following embodiments may be a crossbar RRAM device, but the disclosure is not limited thereto.

Figure 3A:
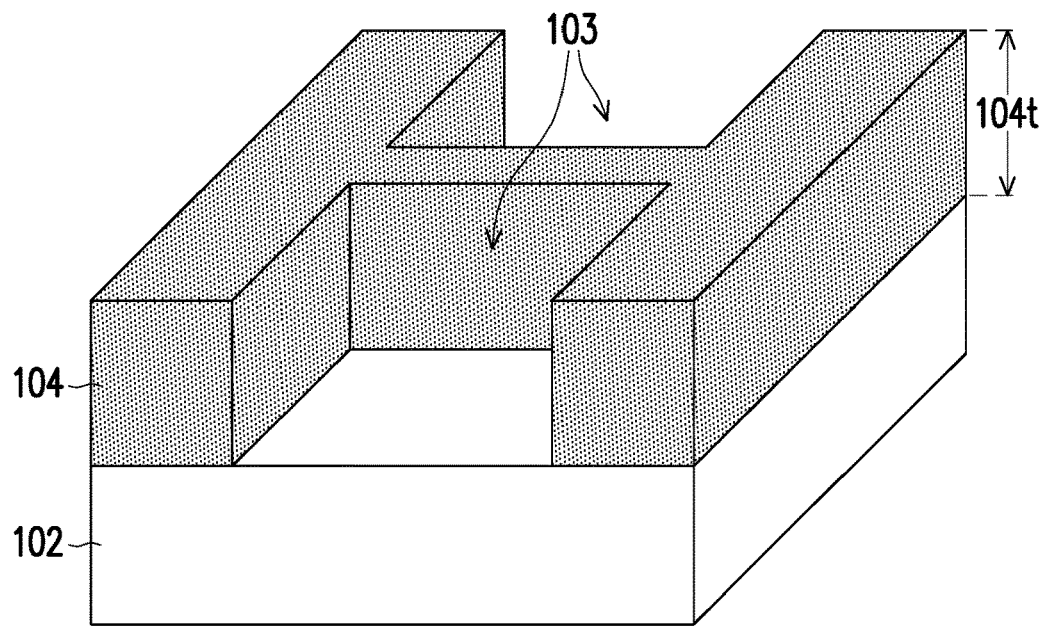
FIG. 3A to FIG. 3I are schematic three-dimensional views of a manufacturing process of a memory device according to a first embodiment of the disclosure.

As shown in FIG. 3A, a substrate 102 is provided. In an embodiment, the substrate 102 includes a semiconductor substrate, e.g., silicon substrate. A conductive layer 104 is formed on the substrate 102. In an embodiment, a method for forming the conductive layer 104 includes forming a conductive material layer and then patterning the conductive material layer to form an opening 103 exposing the substrate 102. In this embodiment, as shown in FIG. 3A, the conductive layer 104 may be shaped as a letter H, but the disclosure is not limited thereto. In an embodiment, the material of the conductive layer 104 includes Ta, Ti W, Al, or a combination thereof. A thickness 104t of the conductive layer 104 thickness may be within a range from 20 nm to 50 nm.

Figure 3B:
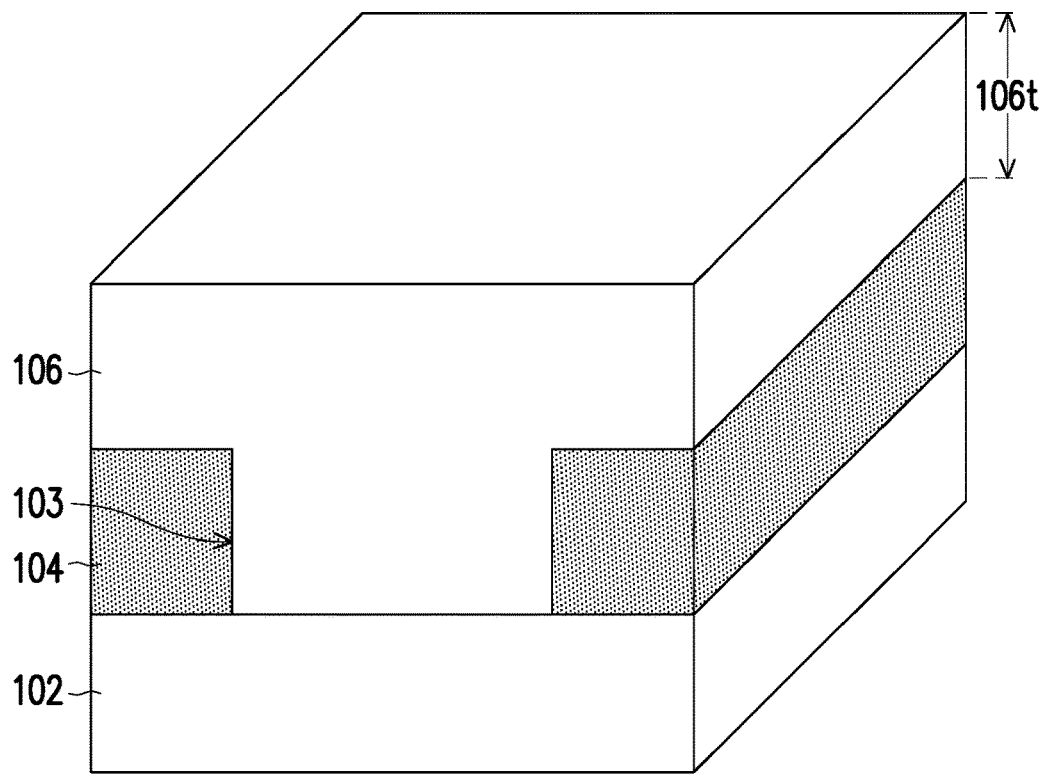

With reference to FIG. 3B, a dielectric layer 106 is formed on the conductive layer 104. The dielectric layer 106 fills the opening 103 and extends to cover a top surface of the dielectric layer 106. In an embodiment, a method for forming the dielectric layer 106 includes forming a dielectric material layer and then planarizing the dielectric material layer. The material of the dielectric layer 106 may include silicon oxide, silicon nitride, silicon oxynitride, or a combination thereof. A thickness 106t of the dielectric layer 106 on the conductive layer 104 may be within a range from 10 nm to 50 nm. In alternative embodiments, the dielectric layer 106 may also be selectively patterned to increase the design flexibility of the memory device.

Figure 3C:
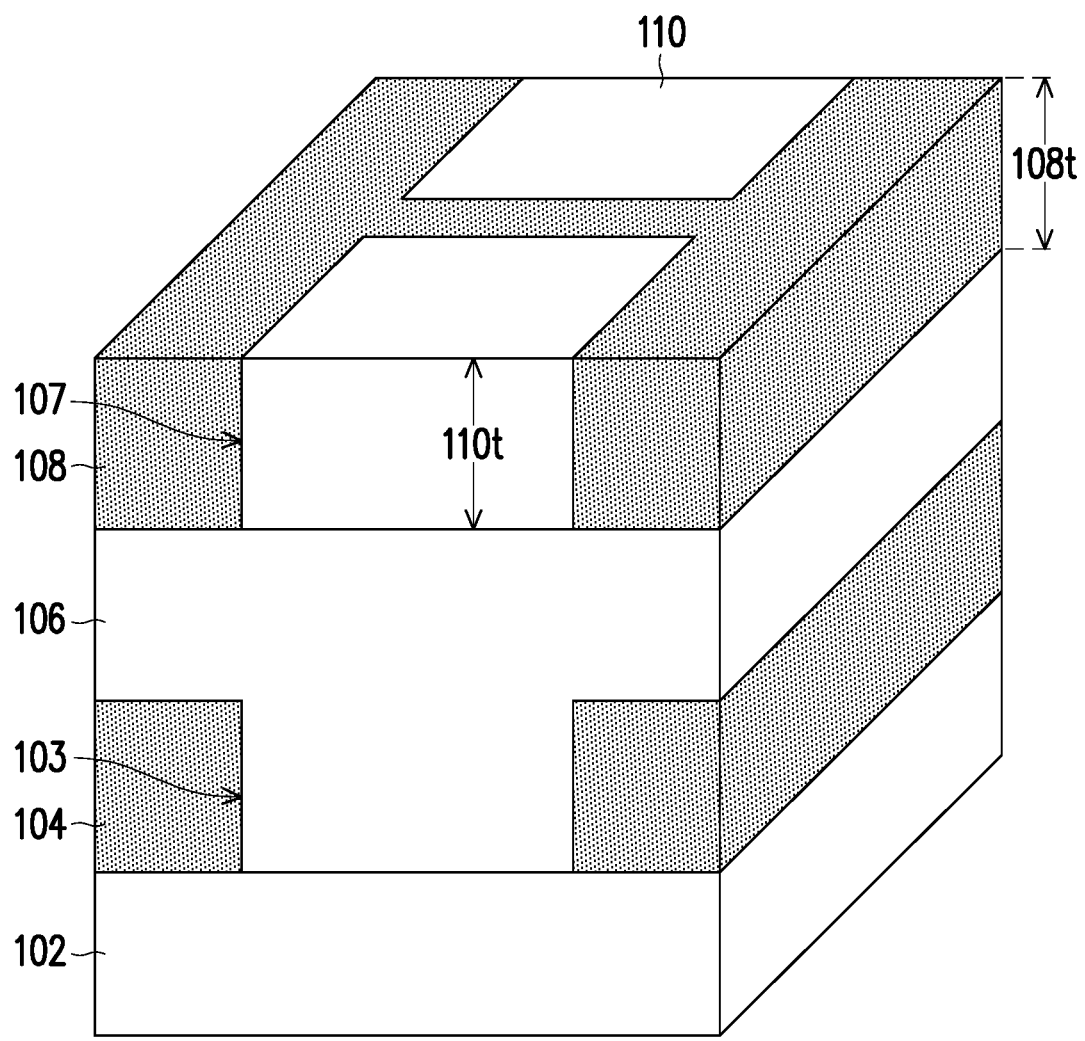

With reference to FIG. 3C, a conductive layer 108 is formed on the dielectric layer 106. In an embodiment, a method for forming the conductive layer 108 includes forming a conductive material layer and then patterning the conductive material layer to form an opening 107 that exposes the dielectric layer 106. In this embodiment, as shown in FIG. 3C, the conductive layer 108 may be shaped as a letter H and correspond to the pattern of the conductive layer 104. In an embodiment, the material of the conductive layer 108 includes Ta, Ti, W, Al, or a combination thereof. A thickness 108t of the conductive layer 108 may be within a range from 20 nm to 50 nm.

Next, the opening 107 is filled with the dielectric layer 110, and then a planarization process, e.g., a chemical-mechanical planarization (CMP) process, is performed, so that the top surface of the dielectric layer 110 and a top surface of the conductive layer 108 are coplanar. In an embodiment, the material of the dielectric layer 110 may include silicon oxide, silicon nitride, silicon oxynitride, or a combination thereof. A thickness 110t of the dielectric layer 110 may be within a range from 10 nm to 30 nm.

Figure 3D:
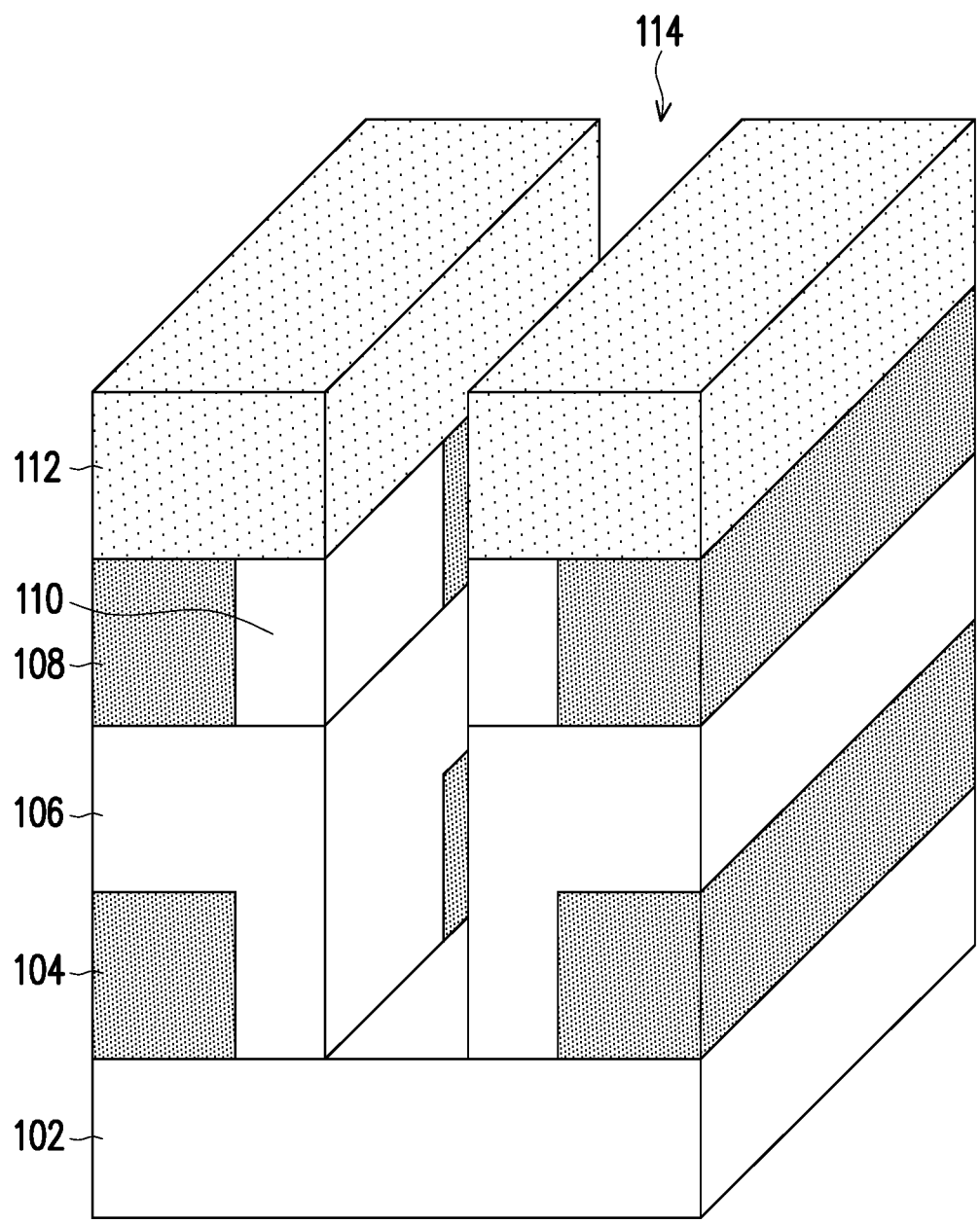

With reference to FIG. 3C and FIG. 3D, a mask pattern 112 is formed on the conductive layer 108 and the dielectric layer 110. A portion of the dielectric layer 110, a portion of the conductive layer 108, a portion of the dielectric layer 106, and a portion of the conductive layer 104 are removed with use of a mask pattern 112 as a mask to form a trench 114. The trench 114 exposes a top surface of the substrate 102.

Figure 3E:
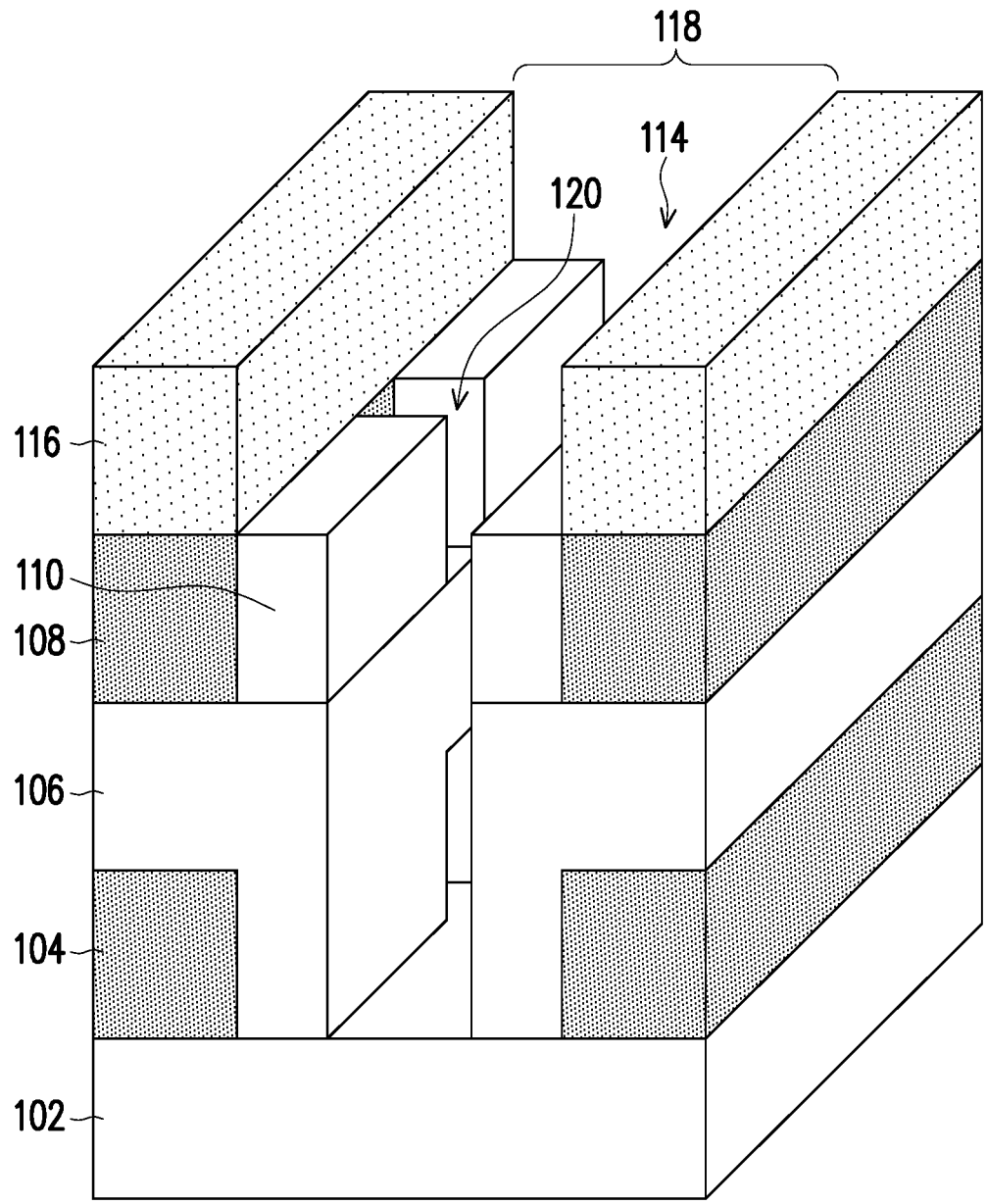

With reference to FIG. 3D and FIG. 3E, after the mask pattern 112 is removed, another mask pattern 116 is formed on the conductive layer 108. The mask pattern 116 has an opening 118. The opening 118 exposes the trench 114, the top surface of the dielectric layer 110, and the conductive layers 108 and 104 protruding between the dielectric layers 106 and 110. An etching process is performed with use of the mask pattern 116 as a mask to remove the conductive layers 108 and 104 protruding between the dielectric layers 106 and 110 and to further form a gap 120. In an embodiment, the etching process includes a wet etching process or an isotropic etching process.

Figure 3F:
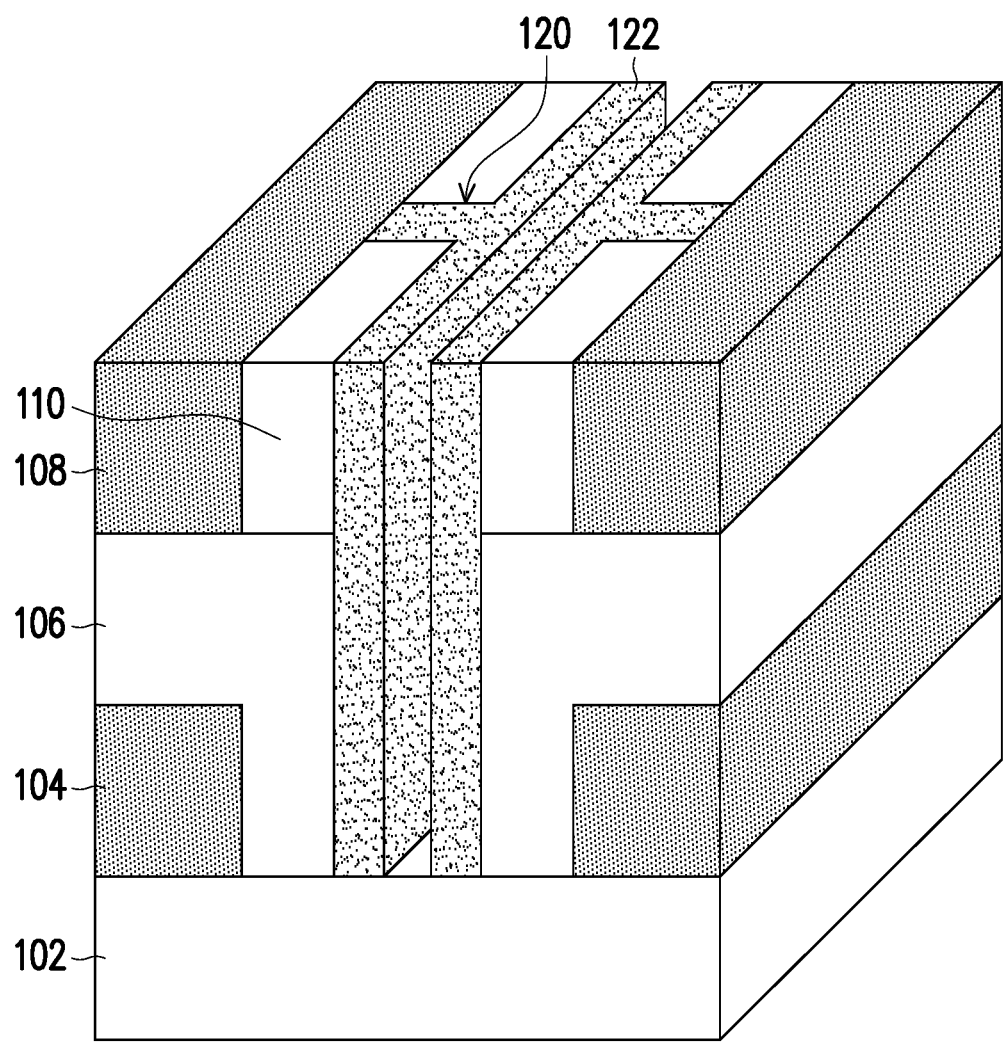

With reference to FIG. 3E and FIG. 3F, after the mask pattern 116 is removed, a resistive material 122 is formed in the gap 120, so that the resistive material 122 completely fills the gap 120 and extends to cover a sidewall of the trench 114. In an embodiment, the resistive material 122 includes a material of a high resistance value, such as TaN, TiN, or a combination thereof. A method of forming the resistive material 122 includes atomic layer deposition (ALD), chemical vapor deposition (CVD), or a combination thereof.

Figure 3G:
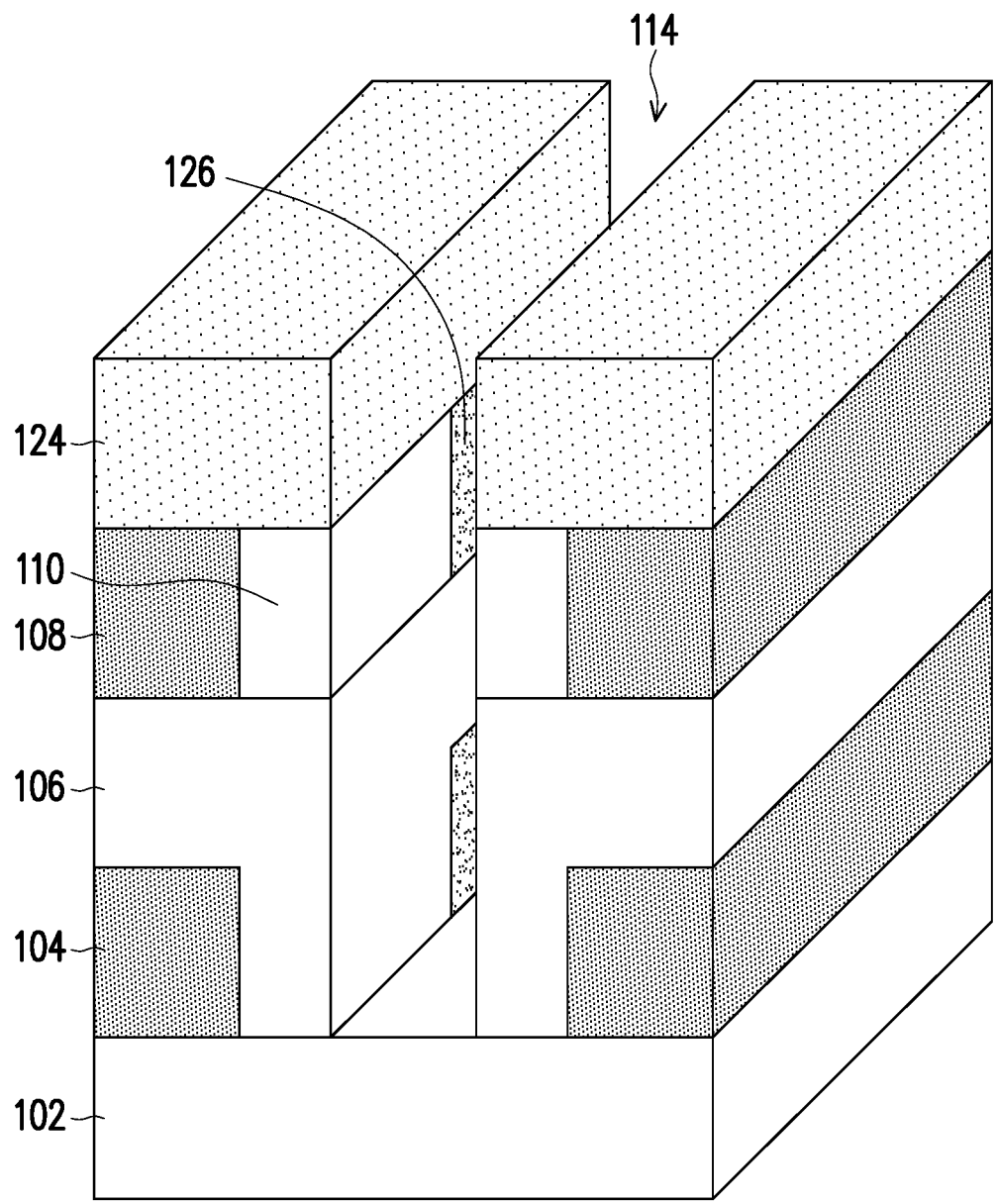

With reference to FIG. 3F and FIG. 3G, a mask pattern 124 is formed on the conductive layer 108 and the dielectric layer 110. A portion of the resistive material 122 exposed outside the trench 114 is removed with use of the mask pattern 124 as a mask. Under such circumstances, the remaining portion of the resistive material 122 is sandwiched between the dielectric layers 106 and 110 and is hereinafter referred to as resistive layers 126.

Figure 3H:
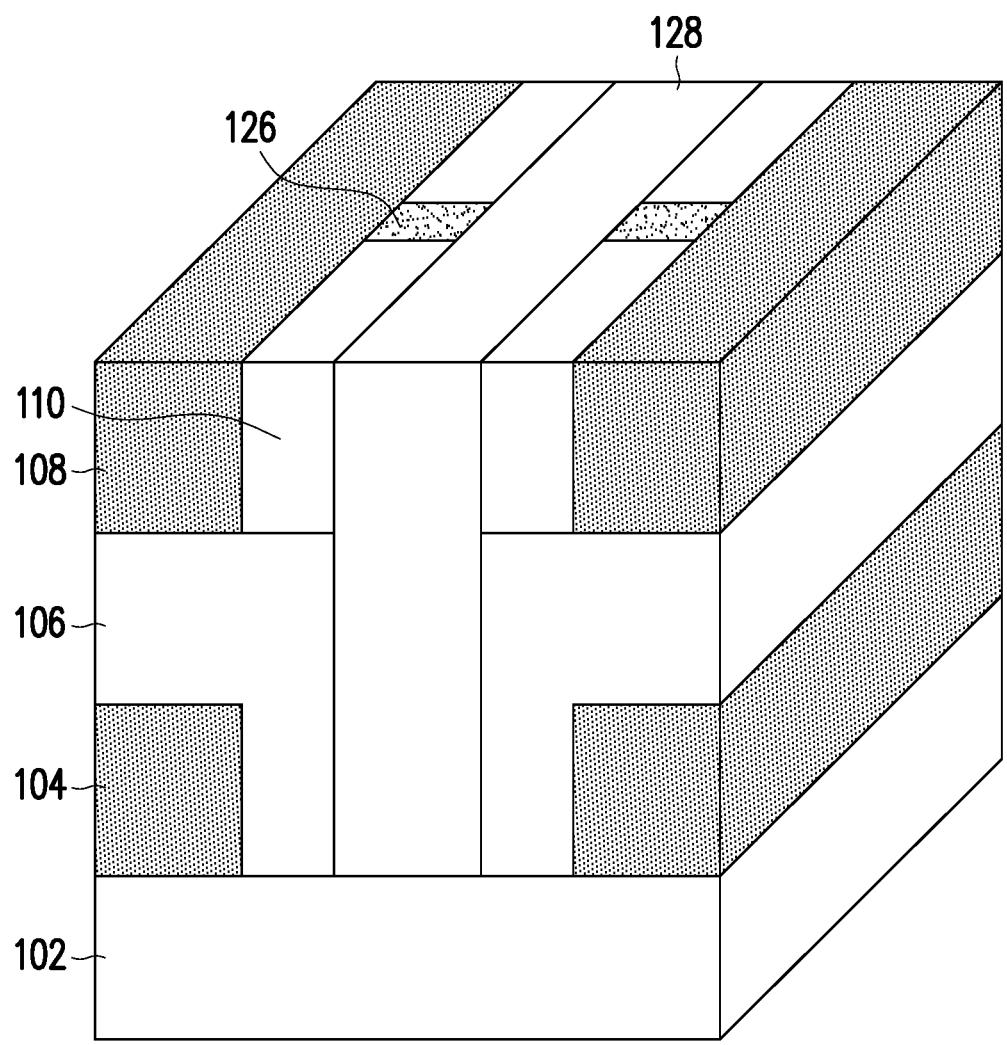

With reference to FIG. 3G and FIG. 3H, after the mask pattern 124 is removed, a dielectric layer 128 is formed in the trench 114. In an embodiment, the material of the dielectric layer 128 may include silicon oxide, silicon nitride, silicon oxynitride, or a combination thereof. In this embodiment, the dielectric layers 128, 110, and 106 have the same dielectric material, such as silicon oxide.

Figure 3I:
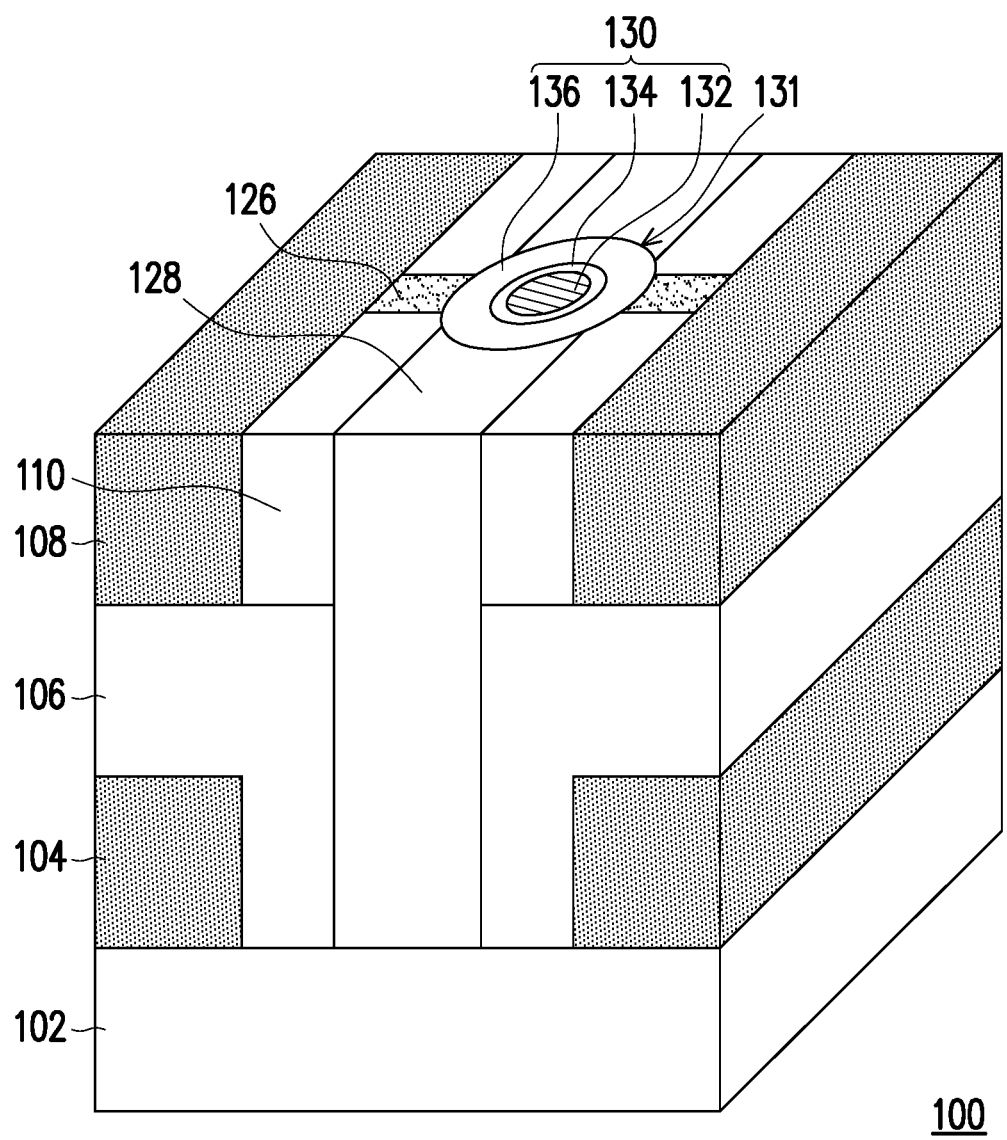

With reference to FIG. 3H and FIG. 3I, a memory structure 130 is formed in the dielectric layer 128 between two adjacent resistive layers 126, thereby completing the memory device 100 provided in the first embodiment of the disclosure. Specifically, the memory structure 130 includes a conductive pillar 132, a barrier layer 134, and a resistive switching layer 136. In an embodiment, a method for forming the memory structure 130 includes: forming an opening 131 in the dielectric layer 128, wherein the opening 131 exposes the top surface of substrate 102; conformally forming the resistive switching layer 136 in the opening 131; conformally forming the barrier layer 134 on the resistive switching layer 136; forming the conductive pillar 132 on the barrier layer 134. It can be known from FIG. 4B that the resistive switching layer 136 is shaped as a cup and has an inner surface 136s1 to define an opening 135. The conductive pillar 132 is disposed in the opening 135. The barrier layer 134 is also shaped as a cup and is disposed between the resistive switching layer 136 and the conductive pillar 132. In an embodiment, the material of the conductive pillar 132 includes Ti, Ta, or a combination thereof, the material of the barrier layer 134 includes $Al_2O_3$, $TiO_x$ or a combination thereof, and the material of the resistive switching layer 136 includes $HfO_2$, $ZrO_2$, $Ta_2O_5$, $TiO_2$, or a combination thereof.

With reference to FIG. 4A and FIG. 4B, the resistive layers 126 are respectively distributed on an outer surface 136s2 of the resistive switching layer 136. In an embodiment, a length 126l of the resistive layers 126 is 10 nm to 100 nm. The conductive layers 104 and 108 are shaped as bars and are respectively connected to the resistive layers 126. In this embodiment, the bar-shaped conductive layers 104 and 108 may be collectively referred to as the bit lines BL. In addition, the conductive pillar 132 may also be electrically connected to the word line WL. Here, each portion of the memory structure 130 connected to one of the resistive layers 126 may be regarded as a memory cell MC. As shown in FIG. 4A, the memory structure 130 is respectively connected to four resistive layers 126, thereby forming four memory cells MC.

In an embodiment, a resistance value of the resistive layers 126 are greater than a resistance value of the conductive pillar 132, a resistance value of the bit lines BL, and a resistance value of the word line WL. Under such circumstances, the resistive layers 126 may serve as contact resistors (as shown in FIG. 2) to hold the voltage when the memory cells MC are turned on, so as to prevent the damages to the caused by snapback. In some embodiments, the resistance value of the resistive layers 126 may be expressed by the following formula:

$$Rc/Rp \geq (Vf-Vr)/Vr = Vf/Vr - 1,$$

where Rc is the resistance value of the resistive layers 126, Rp is the resistance value of the peripheral circuit 20 (as shown in FIG. 2), Vr is the reset voltage, and Vf is the forming voltage. This is to ensure that Rc rather than Rp takes the bulk of the voltage as a result of snapback.

For instance, the resistance value of the resistive layer 126 is 1 KOhm to 3 KOhm; and the resistance value of the resistance switching layer 136 is 5 KOhm to 100 KOhm. In some embodiments, the a ratio of the resistance value of the resistive switching layer 136 to the resistance value of the resistive layer 126 is about 2 to 100.

Figure 5:
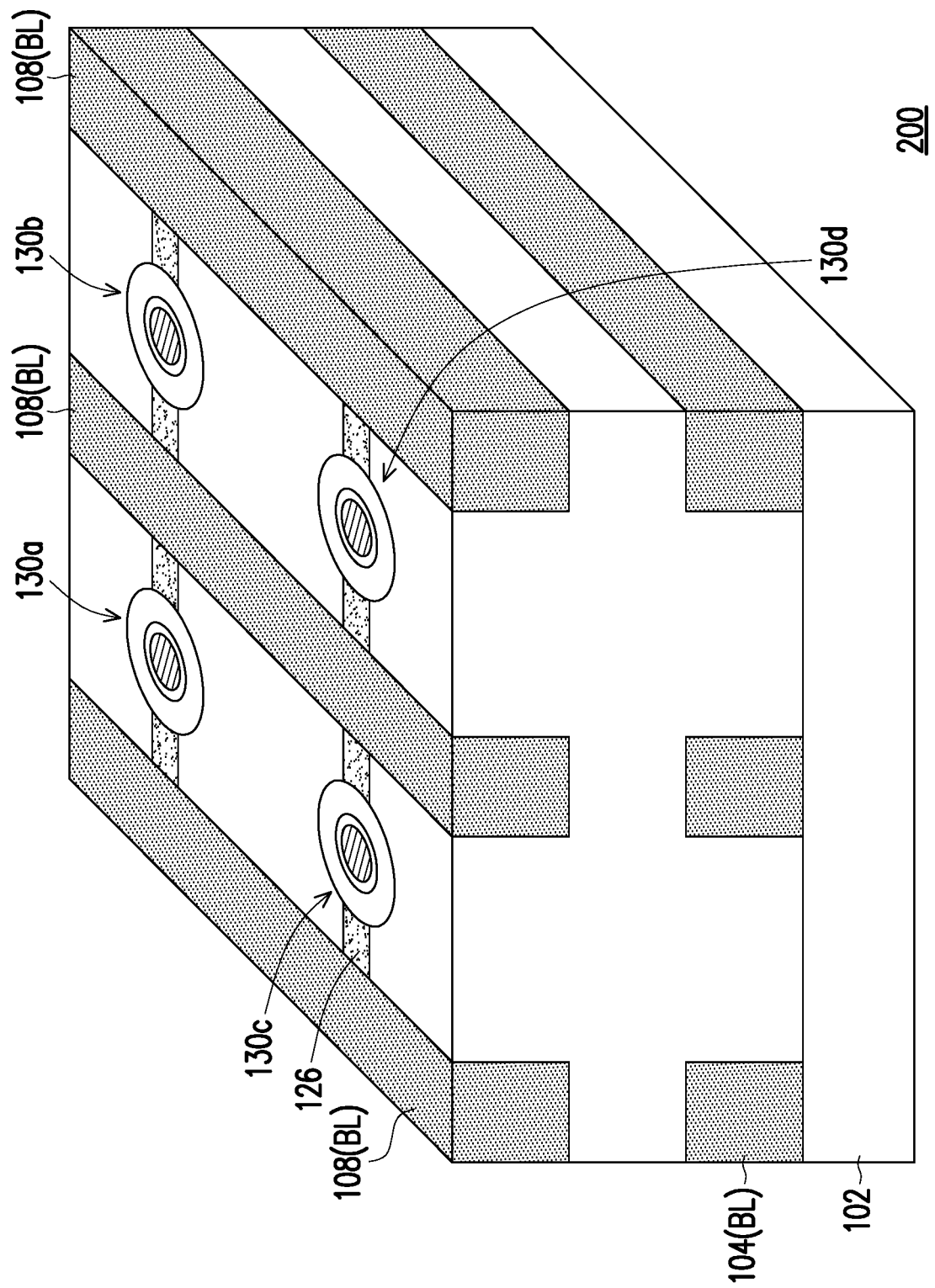
FIG. 5 is a schematic three-dimensional view of a memory device according to a second embodiment of the disclosure.

FIG. 5 is a schematic three-dimensional view of a memory device according to a second embodiment of the disclosure.

With reference to FIG. 5, the memory device 200 provided in the second embodiment of the disclosure is similar to the memory device 100 provided in the first embodiment of the disclosure, and the main difference lies in that the memory device 200 has a memory array. The memory array includes four memory structures 130a, 130b, 130c, and 130d, and the four memory structures 130a, 130b, 130c, and 130d are electrically connected to the bar-shaped conductive layers 104 and 108 (also referred to as the bit lines BL) through the resistive layers 126, respectively.

FIG. 6A to FIG. 6H are schematic three-dimensional views of a manufacturing process of a memory device according to a third embodiment of the disclosure.

Figure 6A:
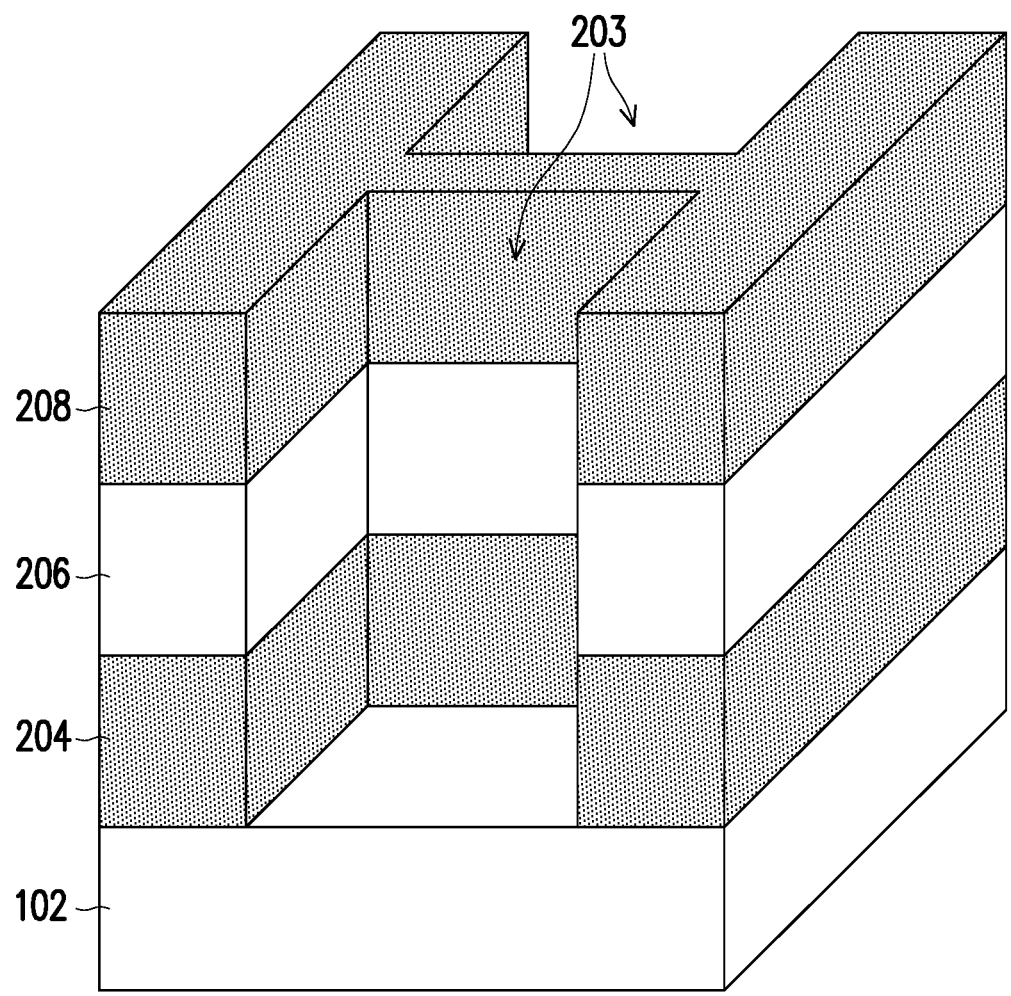
FIG. 6A to FIG. 6H are schematic three-dimensional views of a manufacturing process of a memory device according to a third embodiment of the disclosure.

Specifically, as shown in FIG. 6A, a conductive layer 204, a dielectric layer 206, and a conductive layer 208 are sequentially formed on the substrate 102. In this embodiment, the conductive layer 204, the dielectric layer 206, and the conductive layer 208 are all shaped as a letter H, and a forming method includes: forming a stacked layer structure composed of a conductive material layer, a dielectric material layer, and another conductive material layer, and then patterning the stacked layer structure to form an opening 203 exposing the substrate 102.

Figure 6B:
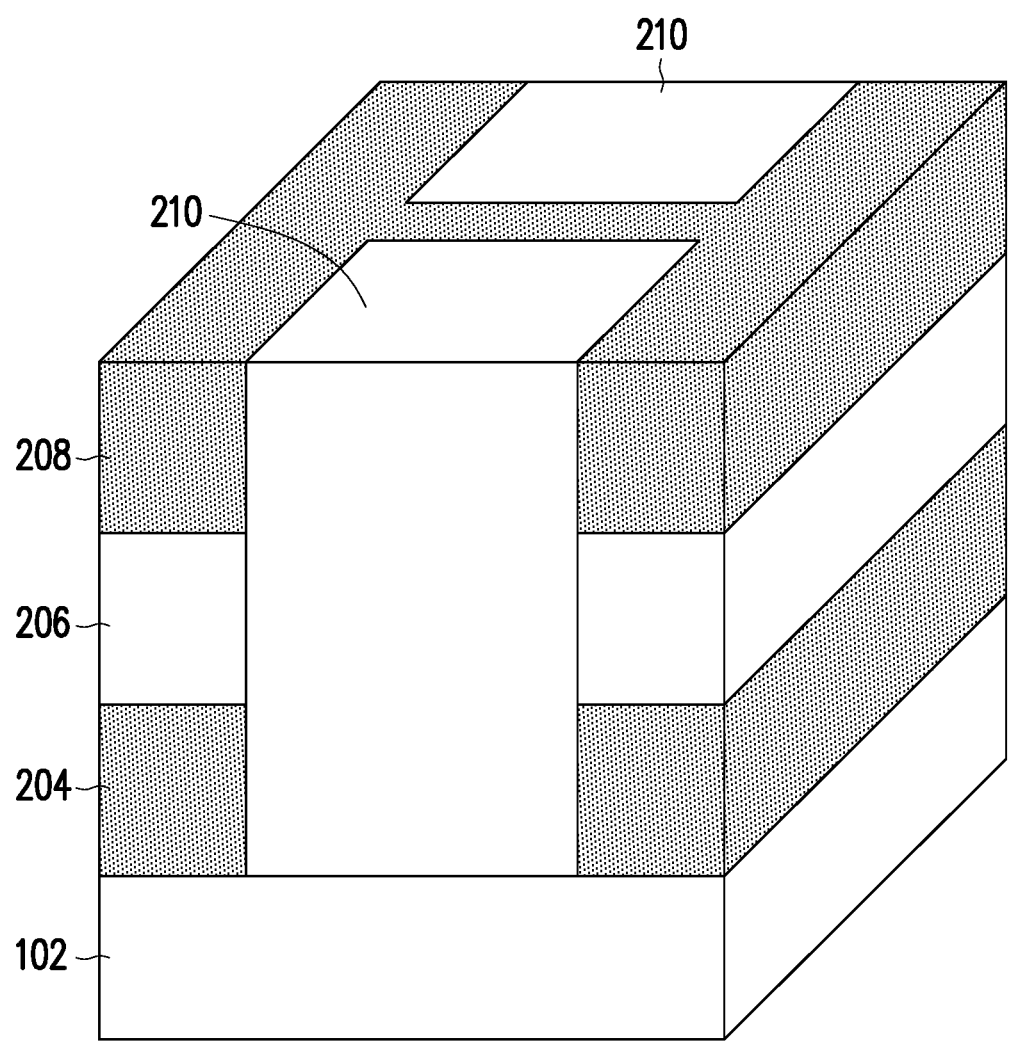
Figure 6C:
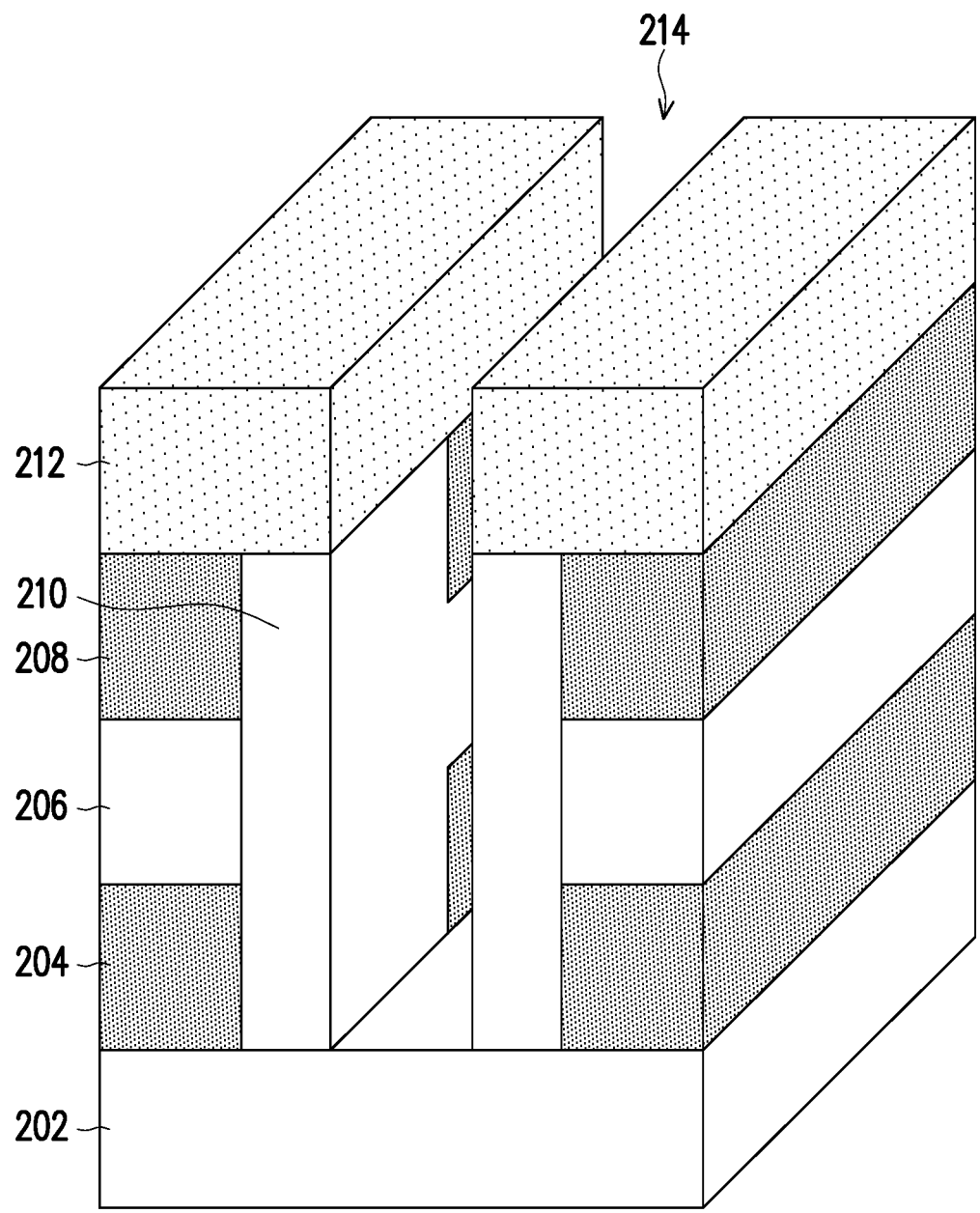
Figure 6D:
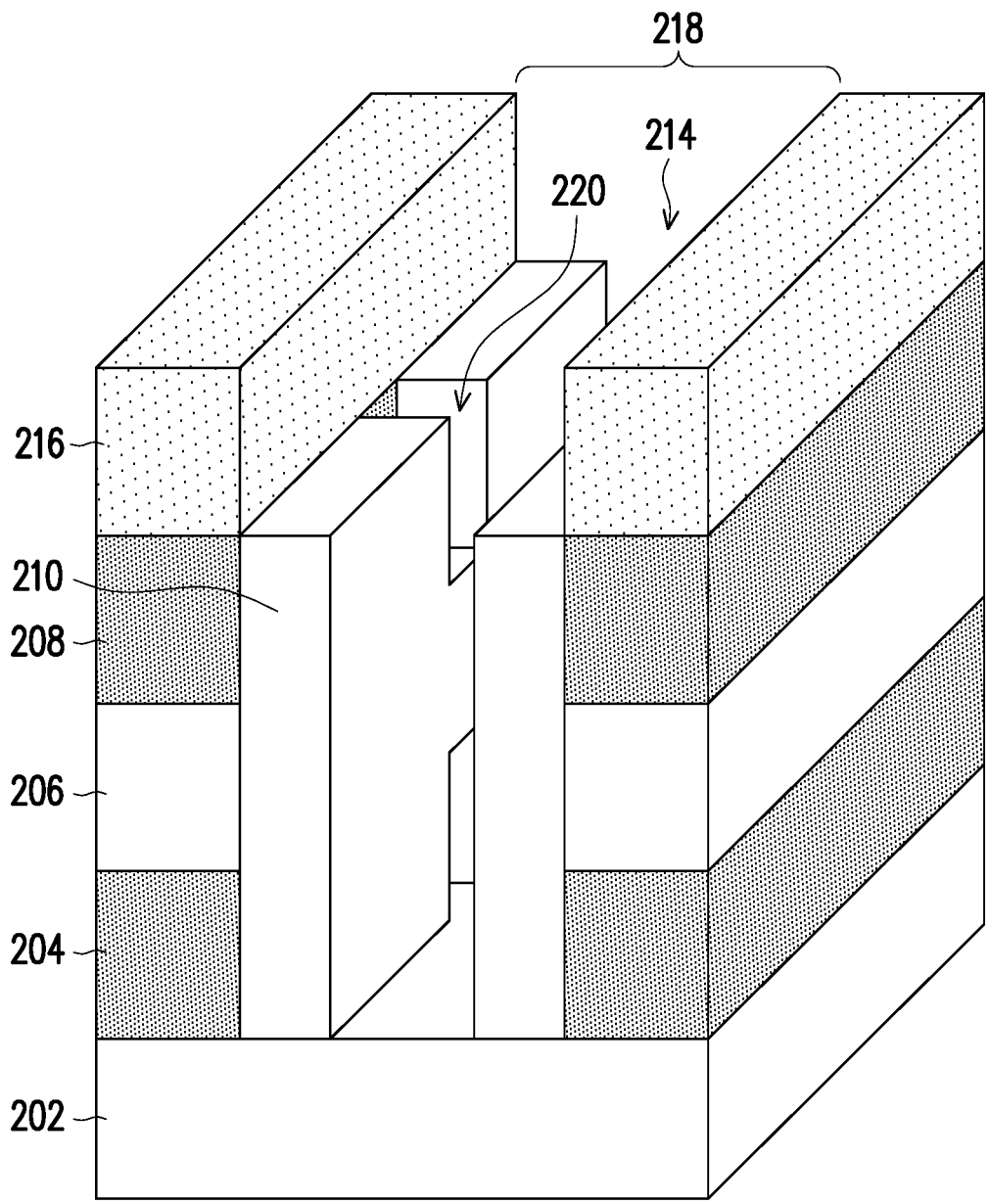
Figure 6E:
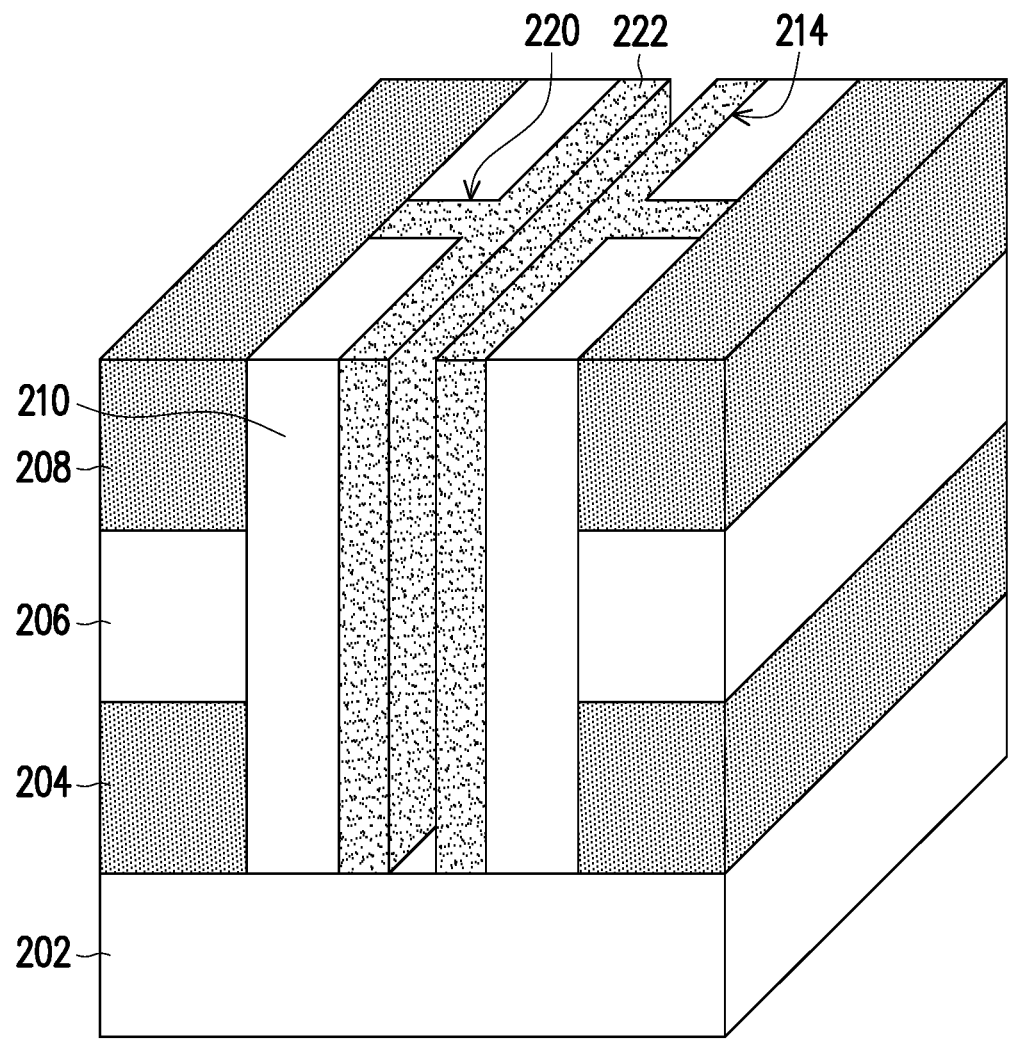
Figure 6F:
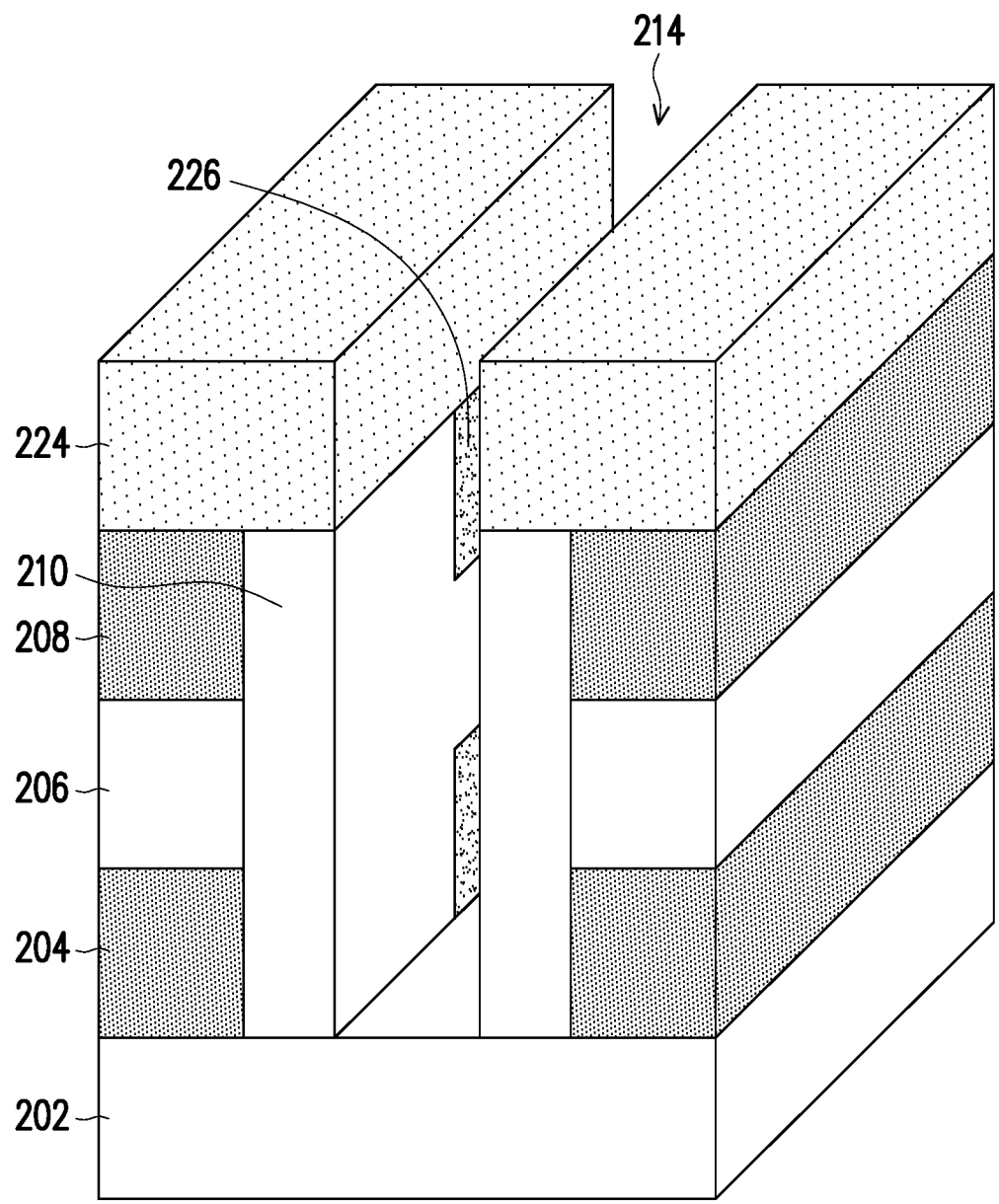
Figure 6G:
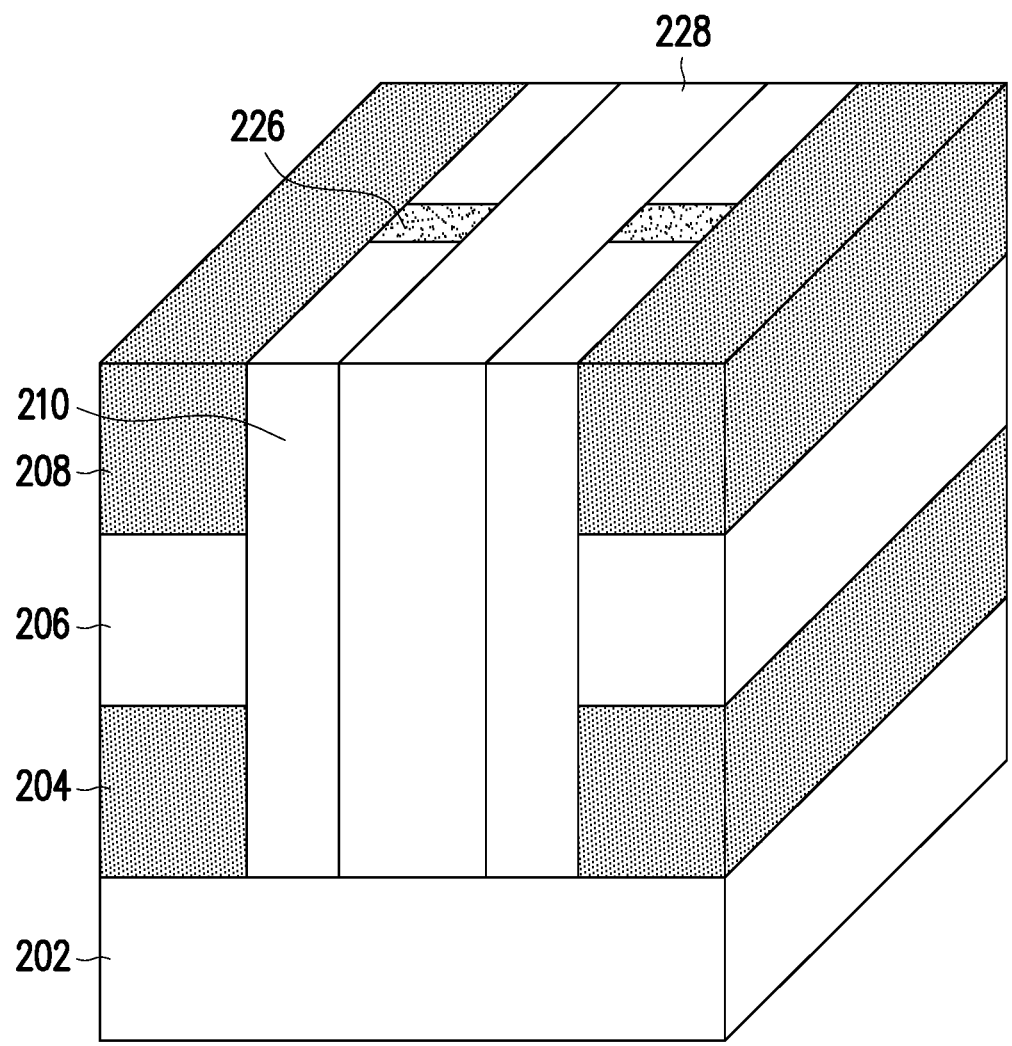
Figure 6H:
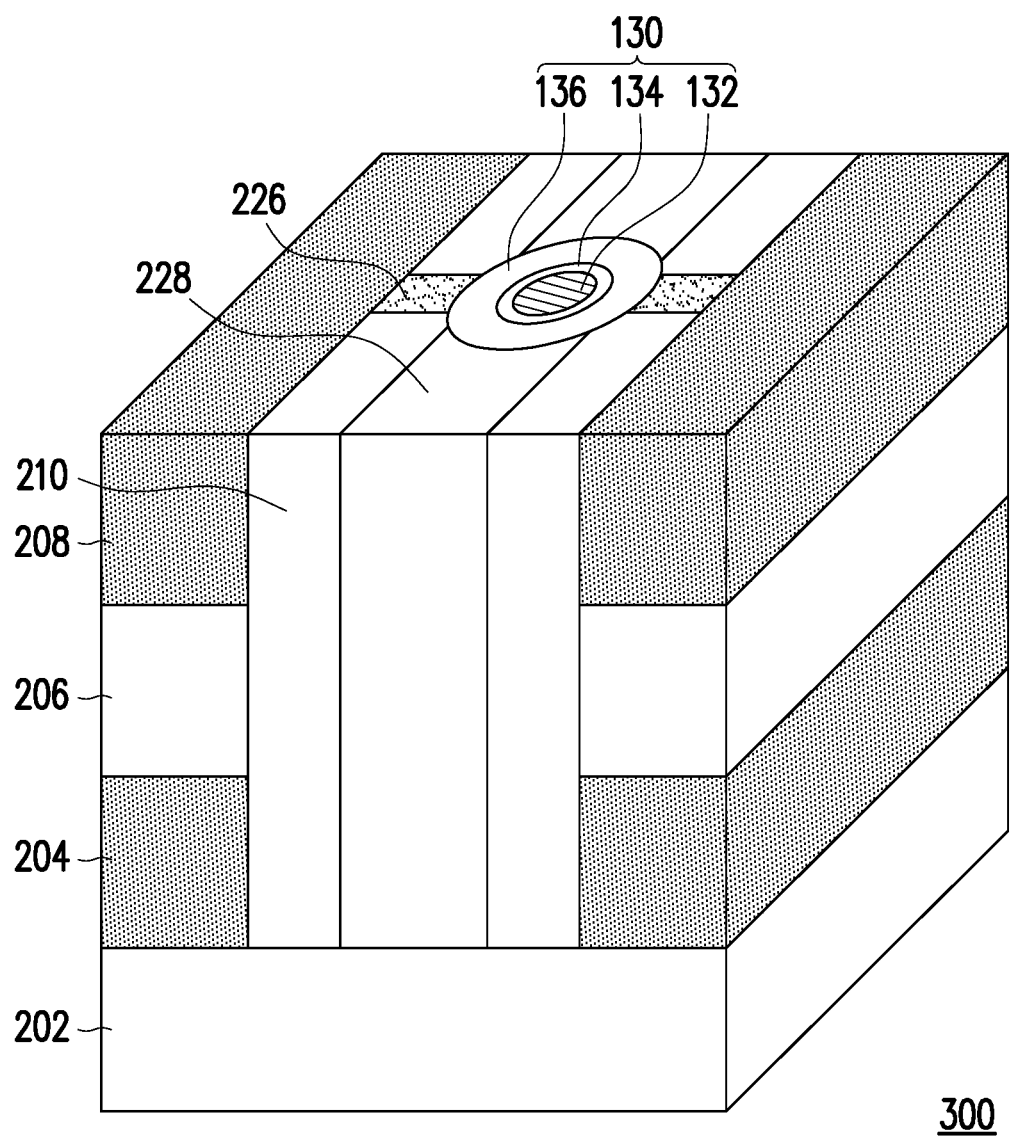

With reference to FIG. 6B, the opening 203 is backfilled with a filling material 210. In FIG. 6C, the protruding portions of the conductive layers 204 and 208 are etched with an isotropic etch, forming a slot 214 while the line-shaped portions of 208 are covered with a mask pattern 212. After the mask pattern 212 is removed, as shown in FIG. 6D, another mask pattern 216 is formed on the conductive layer 208. The mask pattern 216 has an opening 28. The opening 218 exposes the slot 214, the top surface of the dielectric layer 210, and the protruding portions of the conductive layers 208 and 204. An etching process is performed with use of the mask pattern 216 as a mask to remove the protruding portions of the conductive layers 208 and 204 and to further form a gap 220. After the mask pattern 216 is removed, a resistive material 222 is formed in the gap 220, so that the resistive material 222 completely fills the gap 220 and extends to cover a sidewall of the slot 214. Afterwards, a mask pattern 224 is formed on the conductive layer 208 and the dielectric layer 210. A portion of the resistive material 222 exposed outside the slot 214 is removed with use of the mask pattern 224 as a mask. In the case, the remaining portion of the resistive material 222 is sandwiched between the dielectric layers 206 and 210 and is hereinafter referred to as resistive layers 226. After the mask pattern 224 is removed, as shown in FIG. 6G, a dielectric layer 228 is formed in the slot 214. Thereafter, a memory structure 130 is formed in the dielectric layer 228 between two adjacent resistive layers 226, thereby completing the memory device 300 provided in the third embodiment of the disclosure.

Figure 7A:
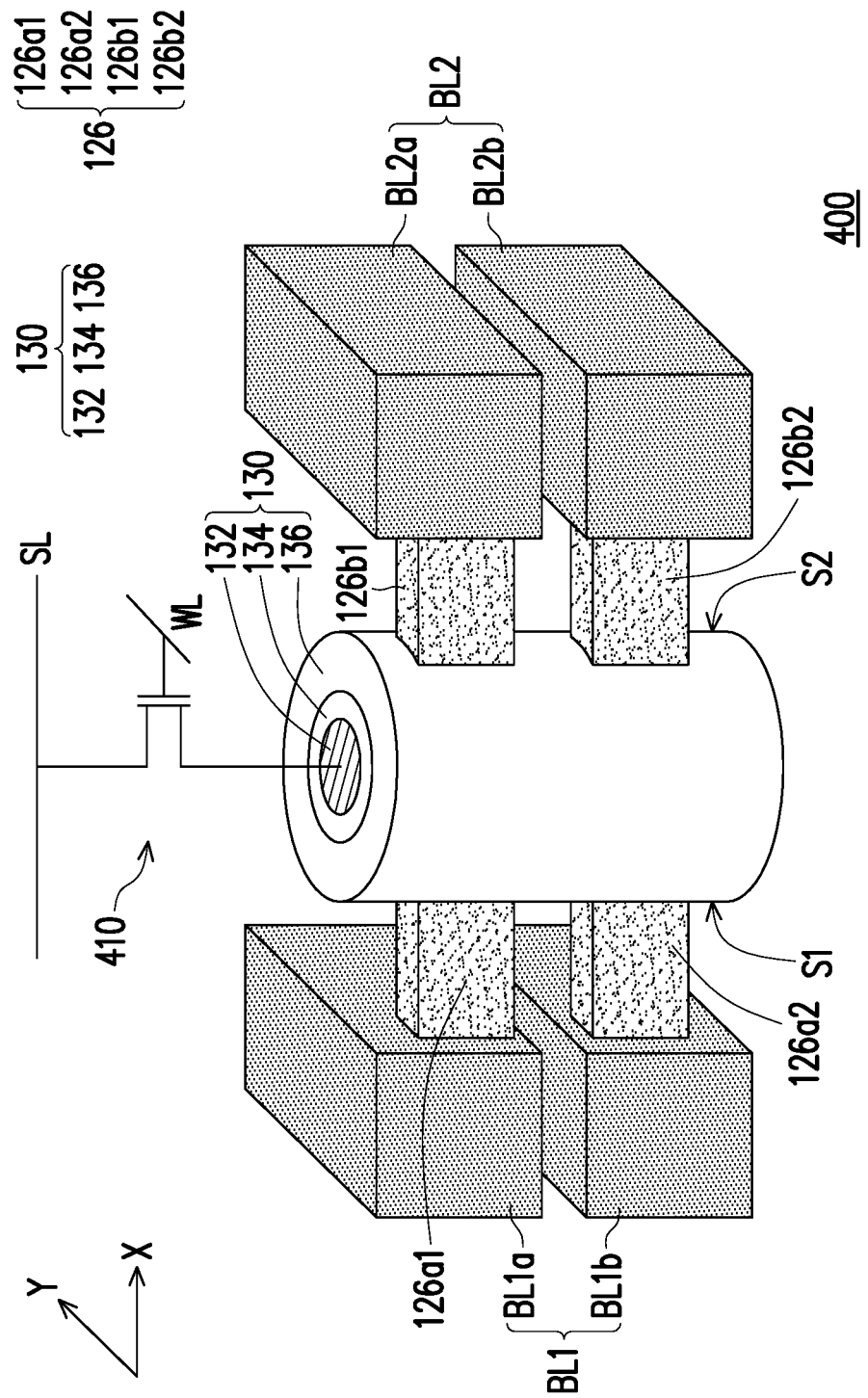
FIG. 7A is a schematic three-dimensional view of a memory device according to a fourth embodiment of the disclosure.
Figure 7B:
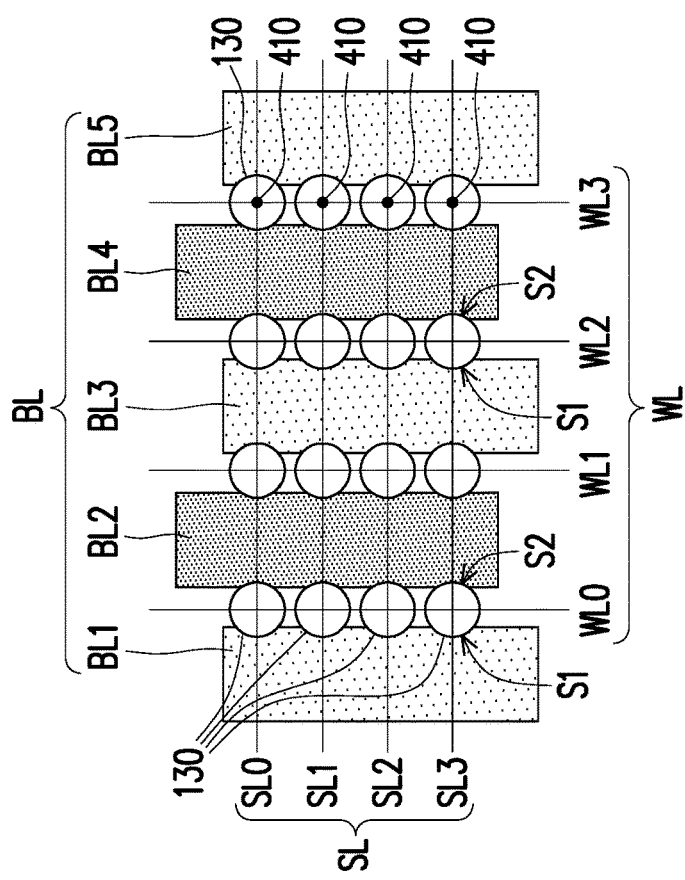
FIG. 7B is a schematic top view of FIG. 7A.

FIG. 7A is a schematic three-dimensional view of a memory device according to a fourth embodiment of the disclosure. FIG. 7B is a schematic top view of FIG. 7A. The memory structure described in the following embodiments may be the memory structure 130 shown in FIG. 4A, but the disclosure is not limited thereto.

With reference to FIG. 7A, a memory device 400 of the fourth embodiment of the disclosure includes a select transistor 410, a memory structure 130, a plurality of resistive layers 126, and a plurality of bit lines BL. Specifically, the memory structure 130 includes a conductive pillar 132, a barrier layer 134, and a resistive switching layer 136. The resistive switching layer 136 is shaped as a cup and has an inner surface to define an opening. The conductive pillar 132 is disposed in the opening. The barrier layer 134 is disposed between the resistive switching layer 136 and the conductive pillar 132. The select transistor 410 is disposed over the conductive pillar 132. However, the disclosure is not limited thereto, in other embodiments, the select transistor 410 may also be disposed below the conductive pillar 132. In some embodiments, the select transistor 410 may be a metal oxide semiconductor field effect transistor (MOSFET) including a gate, a source, and a drain. The gate of the select transistor 410 is electrically connected to the word line WL, and the word line WL may extend along a Y direction. The source of the select transistor 410 is electrically connected to the source line SL, and the source line SL may extend along a X direction. The drain of the select transistor 410 is electrically connected to the conductive pillar 132. The resistive layers 126 are respectively distributed on the outer surface of the resistive switching layer 136. The plurality of bit lines BL include a first bit line (odd bit line) BL1 and a second bit line (even bit line) BL2. As shown in FIG. 7A, the first bit line BL1 includes sub bit lines BL1a and BL1b vertically arranged along the memory structure 130. The sub bit lines BL1a and BL1b are connected to some resistive layers 126a1 and 126a2 at a first side S1 of the memory structure 130. In some embodiments, the sub bit lines BL1a and BL1b are electrically connected to each other. The second bit line BL2 includes sub bit lines BL2a and BL2b vertically arranged along the memory structure 130. The sub bit lines BL2a and BL2b are connected to some resistive layers 126b1 and 126b2 at a second side S2 of the memory structure 130. In some embodiments, the sub bit lines BL2a and BL2b are electrically connected to each other.

With reference to FIG. 7B, the memory device 400 may include a plurality of memory structures 130, a plurality of bit lines BL, a plurality of select transistors 410, a plurality of source lines SL, and a plurality of word lines WL. The plurality of memory structures 130 are arranged as an array. The plurality of bit lines BL includes a plurality of odd bit lines BL1, BL3, BL5 and a plurality of even bit lines BL2, BL4. The odd bit lines BL1, BL3, BL5 are respectively disposed at the first side S1 of the memory structures 130, and the even bit lines BL2, BL4 are respectively disposed at the second side S2 of the memory structures 130. In some embodiments, the odd bit lines BL1, BL3, BL5 are electrically connected to each other. In alternative embodiments, the even bit lines BL2, BL4 are electrically connected to each other. The plurality of select transistors 410 are respectively disposed over the memory structures 130 and have the drains electrically connected to the corresponding conductive pillars 132. The select transistors 410 have the sources electrically connected to the plurality of source lines SL including the source lines SL0, SL1, SL2, SL3, respectively. In some embodiments, the source lines SL0, SL1, SL2, SL3 are extending along the X direction and arranged along the Y direction. The select transistors 410 have the gates electrically connected to the plurality of word lines WL including the word lines WL0, WL1, WL2, WL3, respectively. In some embodiments, the word lines WL0, WL1, WL2, WL3 are extending along the Y direction and arranged along the X direction.

Figure 8:
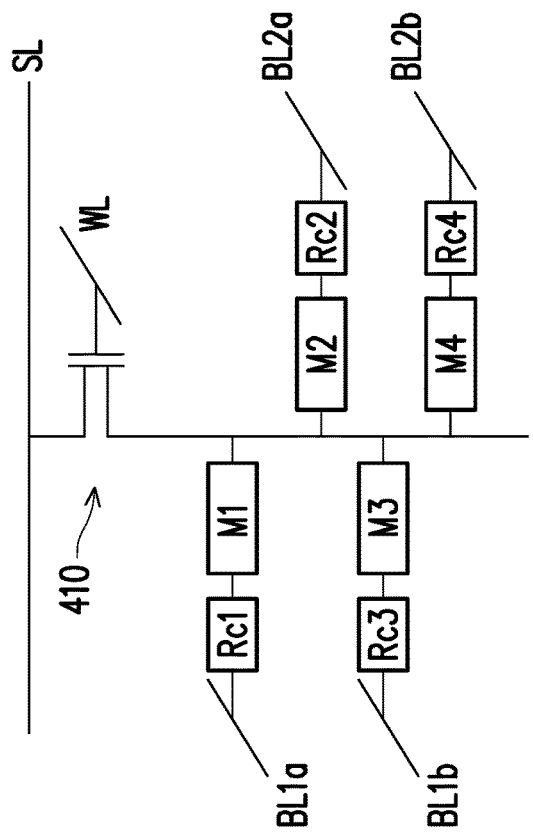
FIG. 8 is a schematic view illustrating an operation of the memory device of FIG. 7A.

FIG. 8 is a schematic view illustrating an operation of the memory device of FIG. 7A.

With reference to FIG. 8, in one embodiment, when the memory cell M1 is selected for performing a reset operation, a gate voltage (Vg) is applied to the word line WL, a reset voltage (Vr) is applied to the source line SL, 0 voltage is applied to the bit line BL1a, and an open circuit voltage is applied to other bit lines BL1b, BL2a, BL2b. The accumulated resistance across three unselected memory cells such as M2, M3, M4 is able to minimize the sneak currents and accidental cell disturbances. In the present embodiment, the accumulated resistance is the total resistance of three contact resistors plus the corresponding resistive switching layers in series. The total resistance is approximately 5-6 times the resistance of the contact resistor Rc1 of the selected memory cell M1.

On the other hands, when the memory cell M1 is selected for performing a set operation, a gate voltage (Vg) is applied to the word line WL, 0 voltage is applied to the source line SL, a set voltage (Vs) is applied to the bit line BL1a, and an open circuit voltage is applied to other bit lines BL1b, BL2a, BL2b. In this case, the memory cell M1 is selected for performing the set operation, and adjacent memory cells M2, M3, M4 are able to decrease the sneak currents and accidental cell disturbances.

Further, when the memory cells M1, M2, M3, and M4 along the memory structure 130 are not selected for performing the operation, 0 voltage is applied to the word line WL, thereby turning off the select transistor 410.

Moreover, under the large bias voltage conditions used in forming, the transistor may suffer nonlinear increases in current. The contact resistor of the present embodiment is able to mitigate any adverse effects from this nonlinearity.

To sum up, in one or more embodiments of the disclosure, the contact resistors with appropriate resistance value are disposed between the bit lines and the memory cells to solve the problem of the peripheral circuit damages caused by snapback during the formation operation, thereby improving the reliability of the memory device. In addition, one or more embodiments of the disclosure provides the set operation and the reset operation of the memory device to reduce the sneak current, thereby preventing interference with the operation or interpretation of the memory device.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A memory device, comprising:
   a memory structure comprising:
   a resistive switching layer, shaped as a cup and having an inner surface to define an opening;
   a conductive pillar, disposed in the opening; and
   a barrier layer, disposed between the resistive switching layer and the conductive pillar;
   a word line, electrically connected to the conductive pillar;
   a plurality of resistive layers respectively distributed on the outer surface of the resistive switching layer, wherein a portion of the memory structure connected to one of the plurality of resistive layers constitutes a memory cell; and
   a plurality of bit lines, electrically connected to the plurality of resistive layers, respectively, wherein each resistive layer has a first sidewall and a second sidewall opposite to each other, the first sidewall is in direct contact with the resistive switching layer, and the second sidewall is in direct contact with a corresponding bit line.

2. The memory device according to claim 1, wherein a resistance value of the plurality of resistive layers is 1 KOhm to 3 KOhm.

3. The memory device according to claim 1, wherein a resistance value of the plurality of resistive layers is greater than a resistance value of the conductive pillar, a resistance value of the word line, and a resistance value of the plurality of bit lines.

4. The memory device according to claim 1, wherein a ratio of a resistance value of the resistive switching layer to a resistance value of the plurality of resistive layers is 2 to 100.

5. The memory device according to claim 1, wherein a length of the plurality of resistive layers is 10 nanometers to 100 nanometers.

6. The memory device according to claim 1, wherein a material of the plurality of resistive layers comprises TaN, TiN, or a combination thereof.

7. The memory device according to claim 1, wherein the barrier layer is conformally disposed in the opening to have a cup-shaped structure, and a material of the barrier layer comprises $Al_2O_3$, $TiO_x$, or a combination thereof.

8. The memory device according to claim 1, wherein a material of the conductive pillar comprises Ti, Ta, Al, W, or a combination thereof.

9. The memory device according to claim 1, wherein a material of the resistive switching layer comprises $HfO_2$, $ZrO_2$, $Ta_2O_5$, $TiO_2$, or a combination thereof.

10. A memory device, comprising:
    a memory structure comprising:
    a resistive switching layer, shaped as a cup and having an inner surface to define an opening;
    a conductive pillar, disposed in the opening; and
    a barrier layer, disposed between the resistive switching layer and the conductive pillar;
    a select transistor, electrically connected to the conductive pillar;
    a plurality of resistive layers respectively distributed on the outer surface of the resistive switching layer, wherein a portion of the memory structure connected to one of the plurality of resistive layers constitutes a memory cell; and
    a plurality of bit lines comprising a plurality of odd bit lines and a plurality of even bit lines, wherein the plurality of odd bit lines are electrically connected to each other and connected to corresponding resistive layers at a first side of the conductive pillar, and the plurality of even bit lines are electrically connected to each other and connected to other corresponding resistive layers at a second side opposite to the first side of the conductive pillar, wherein each resistive layer has a first sidewall and a second sidewall opposite to each other, the first sidewall is in direct contact with the resistive switching layer, and the second sidewall is in direct contact with a corresponding bit line.

\* \* \* \* \*